United States Patent [19]

Yu

[11] Patent Number: 5,262,995
[45] Date of Patent: Nov. 16, 1993

[54] METHOD FOR PRECHARGING IMPUT/OUTPUT LINES OF A MEMORY DEVICE

[75] Inventor: Je-Hwan Yu, Chungcheongnam-do, Rep. of Korea

[73] Assignee: SamSung Electronics Co., Ltd., Kyungki-do, Rep. of Korea

[21] Appl. No.: 724,803

[22] Filed: Jul. 2, 1991

[30] Foreign Application Priority Data

May 24, 1991 [KR] Rep. of Korea ............... 1991-8456

[51] Int. Cl.$^5$ .............................................. G11C 7/00
[52] U.S. Cl. ...................................... 365/203; 365/193
[58] Field of Search ............................. 365/203, 193

[56] References Cited

U.S. PATENT DOCUMENTS

| | | | |
|---|---|---|---|
| 4,722,074 | 1/1988 | Fujishima et al. | 365/203 |
| 4,757,215 | 7/1988 | Seo | 307/452 |
| 4,802,129 | 1/1989 | Hoekstra et al. | 365/203 |
| 4,996,671 | 2/1991 | Suzuki et al. | 365/203 |
| 5,043,945 | 8/1991 | Bader | 365/203 |
| 5,047,984 | 9/1991 | Monden | 365/203 |
| 5,138,578 | 8/1992 | Fujii | 365/203 |

*Primary Examiner*—William L. Sikes
*Assistant Examiner*—Toan Tran
*Attorney, Agent, or Firm*—Robert E. Bushnell

[57] ABSTRACT

A method for maintaining a stable input/output line precharging and equalizing level and performing fast data access during active cycle of a row address strobe signal. In the inventive semiconductor memory device reading out through bit lines information stored in a memory cells, producing the read out information through a selected column line, and precharging or equalizing the input/output lines to a predetermined level by using a first and second precharging circuits connected between the input/output lines, a first precharging signal in accordance with a address for selecting a word line is supplied to the first precharging circuit, during a time interval before the address signal is applied to the first precharging circuit. Then, a second precharging signal in accordance with the address and a column line selecting signal is supplied to the second precharging circuit, during a time interval from receipt of the address signal up to a time when the column line selecting signal is enabled, and the input/output lines are connected to the bit lines with a predetermined potential difference therebetween, in accordance with the column line selecting signal. Thereafter, the second precharging signal is supplied to the second precharging circuit, after the column lines selecting signal is disabled, and then supply of the second precharging signal is completed when the address signal is completed, and the first precharging signal is supplied to the first precharging circuit.

17 Claims, 3 Drawing Sheets

METHOD FOR PRECHARGING IMPUT/OUTPUT LINES OF A MEMORY DEVICE

BACKGROUND OF THE INVENTION

The present invention relates to a memory device, and particularly to a method for precharging the input/output lines of the memory device.

There are various signal transmitting lines in semiconductor memory devices which are following the trend of increasing integration and speed. For example, input/output lines for transmitting input/output data serve as paths for producing, through an output buffer, data read out from a selected memory cell, and commonly serves as paths for supplying external data to a selected memory cell. In the memory devices which are currently used, since information is transmitted through a pair of bits, the input/output lines for transmitting data also are made of a pair of lines corresponding to the pair of bits. In the pair of input/output lines, one of the lines represents memory cell information, while the other line represents a complement value thereof. When information of the selected memory cell appears on such input/output lines in the form of voltages, a sense amplifier senses and amplifies the difference between the two voltages, thereby making it possible to validly recognize the information. In order to efficiently carry out the signal transmission mentioned above, the transmission speeds have to be fast not only in the bit lines of the memory array, but also in the input/output lines thereof, and it has to be taken into account how speedily the voltage potentials input/output lines are split.

FIG. 1 illustrates a column circuit of a memory device, showing the process of transmitting information through bit lines, a sense-amplifier and input/output lines, after reading out the information from a memory cell of a memory device. As shown in this drawing, a p-type sensing amplifier 20 and an n-type sensing amplifier 40 are connected between a bit line BL and a complementary bit line $\overline{BL}$ which are connected to a memory cell array 10, while a separate gate 30 is connected between the p-type sensing amplifier 20 and the n-type sensing amplifier 40, the separate gate 30 connecting respectively the bit line BL and the complementary bit line $\overline{BL}$ to the memory cell array 10.

The separate gate 30 is controlled according to separating clock pulses $\phi$ISO, while the bit lines BL, $\overline{BL}$ are connected through a column gate 50 to input/output lines IO, $\overline{IO}$, while the column gate 50 is controlled according to column selecting signal CSL output from a column decoder which is not shown. Between the input/output line IO and the complementary input/output line $\overline{IO}$, there are connected in parallel a first input/output line precharging circuit 18 and a second input/output line precharging circuit 19. The first circuit 18 includes NMOS transistors 13 and 14 which receive a first precharging signal $\phi$IOPR through their gates, while the second circuit 19 includes three NMOS transistors 15, 16 and 17 which receive a second precharging signal $\phi$IOP through their gates. A connection to the channels of the two transistors 13 and 14 in the first precharging circuit 18 is supplied with input/output line precharging voltage VIOPR of ($\frac{1}{2}$)Vcc level.

In the second precharging circuit 19, the channels of the NMOS transistors 15 and 17 are respectively connected between a power terminal Vcc, and the input/output lines IO and $\overline{IO}$, while the channel of the NMOS transistor 16 is connected between the input/output lines IO, and $\overline{IO}$. Meanwhile and an input/output sense amplifier which is not shown, capable of sensing and amplifying the potential difference between the input/output lines, is connected to the input/output lines IO, $\overline{IO}$. It is noted that such structure is known. It is further noted that the column circuit of FIG. 1 is a basic circuit for describing the precharging methods of the present invention.

FIGS. 2A and 2B illustrate the conventional embodiments for generating the first and second precharging signals $\phi$IOPR, $\phi$IOP. Referring to FIG. 2A, the first precharging signal $\phi$IOPR is obtained by inverting a row address signal RAi. Referring to FIG. 2B, the pulse width of a column address transition signal $\overline{ATS}$ is adjusted by three inverters 22, 23 and 24 and a NOR gate 25, and the signal output from the NOR gate 25 together with a column enabling signal $\phi$YE are applied to a NAND gate 26. The signal output from the NAND gate 26 is applied to an inverter 27 to generate the second precharging signal $\phi$IOP. It is apparent from FIGS. 2A and 2B that conventionally the first precharging signal $\phi$IOPR is generated according to the row address signal RAi. It is further apparent that the second precharging signal $\phi$IOP is enabled to high state only when the column address is transmitted in the condition of the column enabling signal $\phi$YE being enabled to high state, so as drive the second precharging circuit 19 of FIG. 1.

Now the operation of the column circuit of FIG. 1 which is related to the conventional input/output precharging method will be described referring to the operational timing diagrams of FIG. 2C. First, since the first precharging signal $\phi$IOPR is high state before a row address strobe signal $\overline{RAS}$ is enabled to high state, the input/output line precharging voltage VIOPR is supplied through the first precharging circuit 18 to the lines IO, $\overline{IO}$, so that the input/output lines are precharged and equalized to ($\frac{1}{2}$)Vcc level. Thereafter, if the signal $\overline{RAS}$ is enabled to low state, and if the row address signal RAi is applied, the signal $\phi$IOPR is disabled to low state. When the information of the memory cell, which is selected by input of the row address signal RAi, appears on the bit lines, the sensing clock pulses LA, $\overline{LA}$ are enabled so that the potential difference between the lines BL, $\overline{BL}$ is amplified as much as $\Delta$VO. In this case, it is a well known fact that the bit lines BL, $\overline{BL}$ are equalized to ($\frac{1}{2}$)Vcc level.

When the bit lines are split as much as a potential difference of $\Delta$V0 by the sensing amplifiers 20 and 40, the column enable signal $\phi$YE is enabled to high state, so that the column selecting signal CSL is enabled to high state. Thus, the bit lines BL, $\overline{BL}$, which are split by as much as a given potential difference, are connected to the input/output lines IO and $\overline{IO}$ which are precharged to a ($\frac{1}{2}$)Vcc level by means of the first precharging signal $\phi$IOPR. A charge sharing occurs between the input/output lines and the bit lines which are connected by the column gate 50.

As the result of the charge sharing, the potential of the bit line which is higher than the potential of the precharge level ($\frac{1}{2}$)Vcc, is dropped as much as $\Delta$V1, while the potential of the bit line which is lower than the potential of the precharged level ($\frac{1}{2}$)Vcc, is increased as much as $\Delta$V2, as shown in FIG. 2C. Accordingly, immediately after the connection between the pair of the bit lines BL, $\overline{BL}$ and the pair of the input/output lines IO, $\overline{IO}$, the potential difference between the bit lines is reduced to $\Delta V0-(\Delta V1+\Delta V2)=\Delta V3$. Then the potentials of the bit lines BL and $\overline{BL}$ are respectively charged to Vcc and 0 voltage by the p-type sensing amplifier 20 and the n-type sensing amplifier 40. Meanwhile, the input/output lines IO and $\overline{IO}$ are also split in accordance with the level variation of the bit lines. In this case, however, since the potential difference $\Delta V3$ which appears initially on the input/output lines is low, it takes much time to form a desired potential difference, with the result being that the overall read-cycle of data is extended. That is, when the potential difference between the bit lines is transferred through the column gate 50 to the input/output lines, any undesired potential difference should be limited to the minimum.

In the process of such operation, the second precharging signal $\phi IOP$ controlling the second precharging circuit 19 is enabled only when there is a transition in the column address, that is, when the column address transition signal $\overline{ATS}$ is triggered from high state to low state, as described above. Therefore, as described above, when the data are accessed in accordance with the row address strobe signal $\overline{RAS}$ without transition of the column address ($T_{RAC}$ condition), the second precharging signal is maintained at low state. That is, the second precharging circuit 19 of FIG. 1 is not driven, with the result that the splitting speed of the input/output lines is delayed in an $\overline{RAS}$ active cycle, and that a precharge voltage terminal $(\frac{1}{2})Vcc$ becomes unstable during the precharging of the input/output lines.

Furthermore, according to the conventional method, if the $\overline{RAS}$ signal is enabled to high state, the input of the row address signal RAi is terminated, that is, the row address signal RAi is enabled to low state, and consequently, the first precharging signal $\phi IOPR$ is enabled to high state, with the result that the input/output lines IO, $\overline{IO}$ are precharged to $(\frac{1}{2})Vcc$ level. Under this condition, however, if the input/output line precharging voltage terminal VIOPR of half-Vcc level and the input/output lines IO and $\overline{IO}$ are connected, current from the input/output line IO (or the input/output line $\overline{IO}$) having a potential higher than $(\frac{1}{2})Vcc$ level flows into the precharge voltage terminal VIOPR, and then, the current from the precharge voltage terminal VIOPR flows into the complementary input/output line $\overline{IO}$ (or the input/output line IO) having a potential lower than the precharge level. Consequently, there arises the problem that the characteristic level of the input/output line precharging voltage VIOPR, i.e., the $(\frac{1}{2})Vcc$ value, becomes unstable.

SUMMARY OF THE INVENTION

Therefore it is an object of the present invention to provide a method of precharging input/output lines in a memory device which has fast splitting speed of the input/output lines under the condition of data accessing by an $\overline{RAS}$ signal ($T_{RAC}$ condition).

It is another object of the present invention to provide an input/output line precharging method in which the precharge voltage terminal can be maintained in a stable state when the input/output lines are precharged within the $\overline{RAS}$ precharging cycle, in the memory device.

According to an aspect of the present invention, the method of the present invention is applied to a semiconductor memory device reading out through bit lines information stored in memory cells in accordance with a word line selected by an address signal, producing the read out information through a selected column line, and precharging or equalizing the input/output lines to a predetermined level by using a first and second precharging circuits connected between the input/output lines.

In achieving the above objects, the input/output line precharging method according to the present invention, includes steps of: supplying the first precharging circuit with a first precharging signal in accordance with the address for selecting the word line, during a time interval before the address signal is applied thereto; supplying the second precharging circuit with a second precharging signal in accordance with the address and a signal for selecting the column line, during a time interval from receipt of the address signal up to a time when the signal for selecting the column line is enabled; connecting the input/output lines to the bit lines with a predetermined potential difference therebetween, in accordance with the signal for selecting the column line; supplying the second precharging circuit with the second precharging signal after the signal for selecting the column lines is disabled; and completing supply of the second precharging signal when the address signal is completed, and supplying the first precharging circuit with the first precharging signal.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
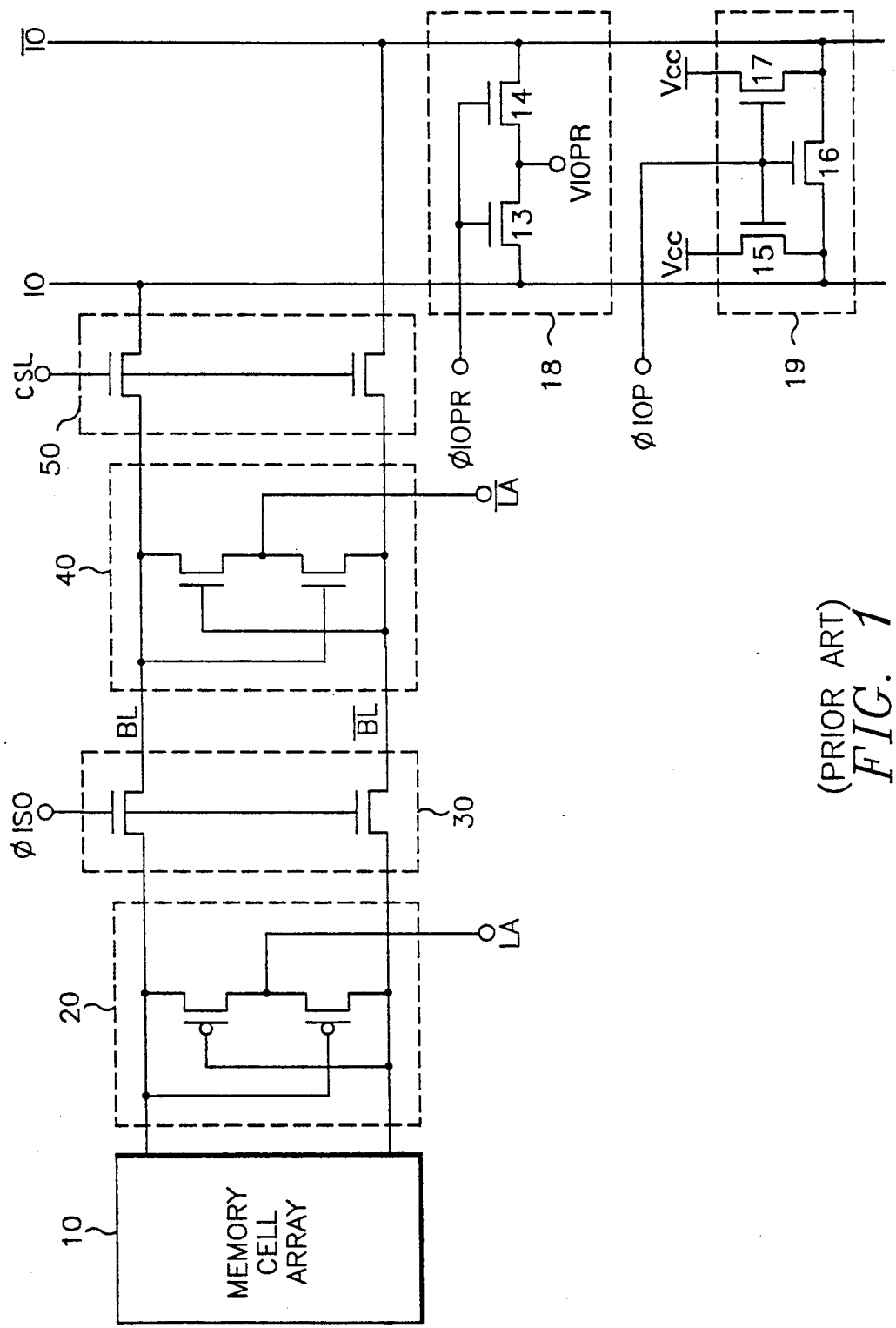
FIG. 1 illustrates a column circuit of a memory device.

The input/output precharging method according to the present invention will be described referring to FIG. 3. In applying the method of the present invention, a column circuit of FIG. 1 is taken as the basis.

Figure 2A:
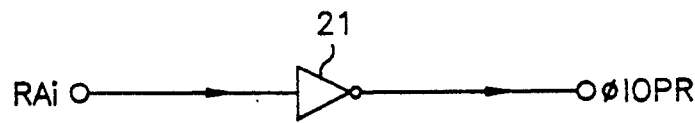
FIGS. 2A and 2B illustrate circuits for generating an input/output line precharging signal according to the conventional method.
Figure 2B:
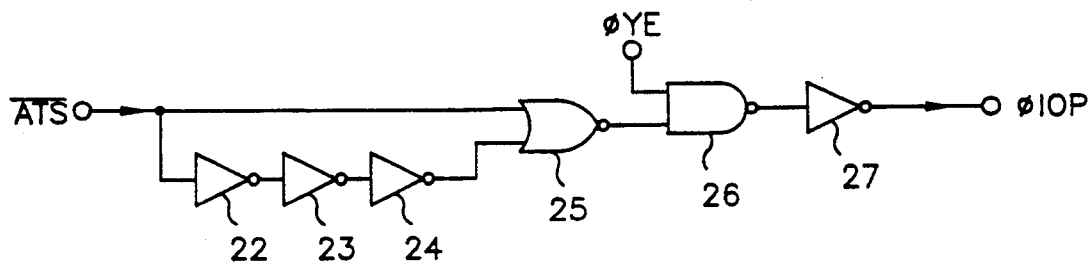
Figure 2C:
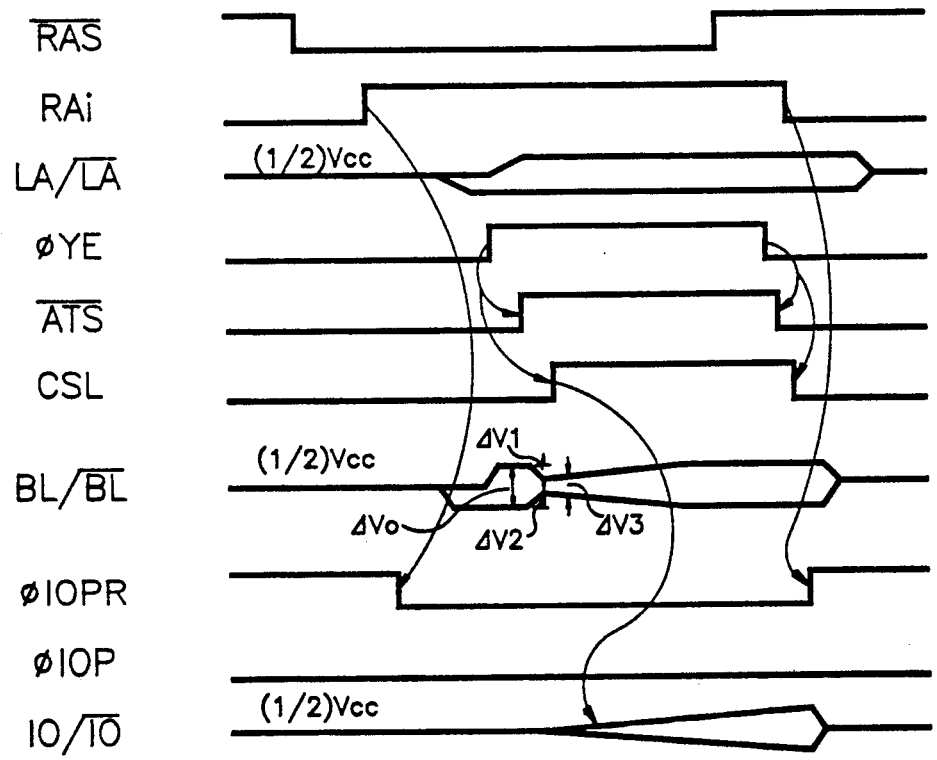
FIG. 2C reveals operational timing diagrams according to the conventional method.
Figure 3A:
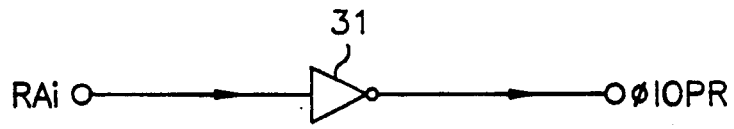
FIGS. 3A and 3B illustrate circuits for generating an input/output line precharging signal according to the present invention.

FIG. 3A illustrates a circuit for generating a first precharging signal $\phi IOPR$ for use in the method of the present invention, and this signal is obtained by inverting the row address signal RAi, as shown in FIG. 2A. However, referring to FIG. 3B which illustrates a circuit for generating a second precharging signal $\phi IOP$, the row address signal RAi and a column enabling signal $\phi YE$ which is inverted by an inverter 32 are logically combined by a NAND gate 33 unlike the case of FIG. 2B, and then, the signal output from the NAND gate 33 is inverted by an inverter 34, thereby obtaining the second precharging signal $\phi IOP$.

Figure 3B:
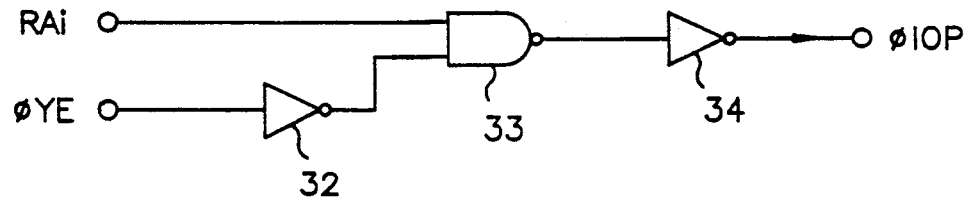

The second precharging signal $\phi IOP$ according to the present invention can also be generated by applying a circuit which is different from the gate circuit of FIG. 3B. That is, the circuit of FIG. 3B can be constituted by a circuit which is designed to be enabled when the row address signal RAi and the column enabling signal $\phi YE$ are respectively at high and low state, or at low and high state, as shown in the timing diagrams of FIG. 3C.

The descriptions following below will start from a state in which the potential difference between a pair of bit lines BL, $\overline{BL}$ is $\Delta VO$, as information of a selected memory cell is sensed and amplified by sensing amplifiers 20 and 40 of FIG. 1. The procedures which have happened before the above state were already sufficiently described, and therefore, those skilled in the art will sufficiently understand it.

Figure 3C:
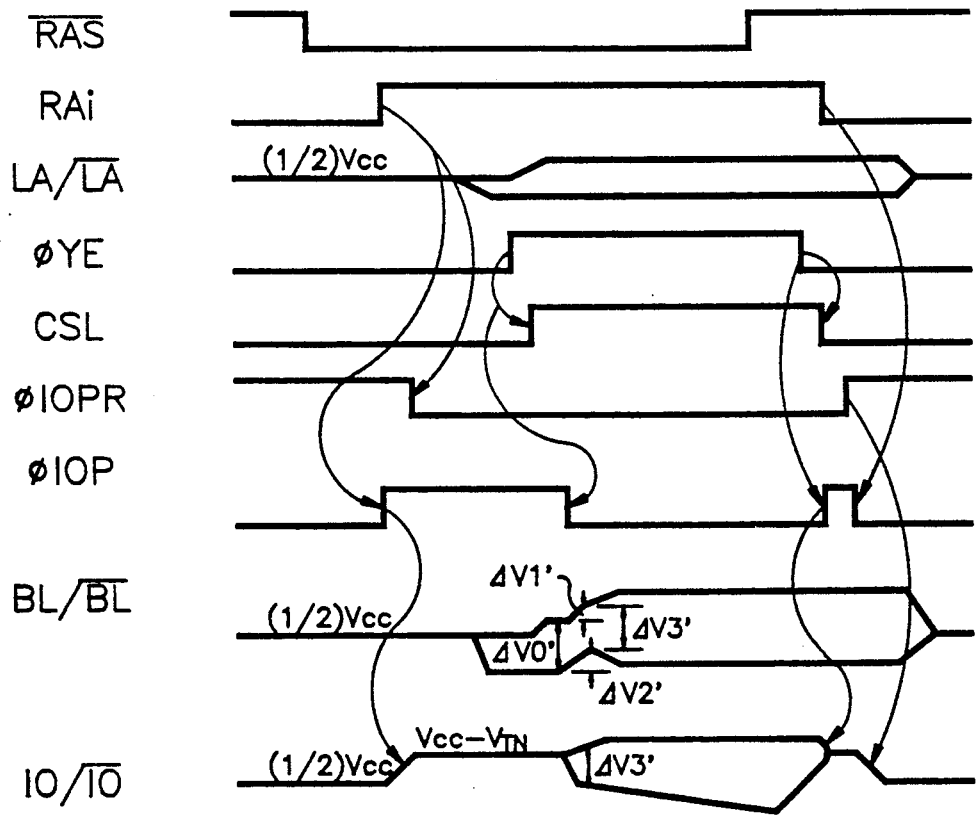
FIG. 3C reveals operational timing diagrams according to the present invention.

Referring to FIG. 3C, if the row address signal RAi is applied to the circuit at high state before the column enabling signals $\phi$YE is enabled to high state, the first precharging signal $\phi$IOPR is disabled to low state, and therefore, a pair of input/output lines IO and $\overline{IO}$ are disconnected from a precharge voltage terminal VIOPR of ($\frac{1}{2}$)Vcc level. Then, the second precharging signal $\phi$IOP is enabled to high state, and therefore, the potentials of the input/output lines IO and $\overline{IO}$, which have been equalized to ($\frac{1}{2}$)Vcc level rise to Vcc−Vtn level. In this case, the Vtn is the threshold voltage of an NMOS transistor 15 or 17 in a second precharging circuit 19, and the ($\frac{1}{2}$) Vcc level will be called a first precharge level and the Vcc−Vtn a second precharge level.

When a column enabling signal $\phi$YE is enabled to high state in a state were the input/output lines IO and $\overline{IO}$ are equalized to the second precharge level, the second precharging signal $\phi$IOP is disabled to low state and a column selecting signal CSL is enabled, so that the bit lines BL, $\overline{BL}$ having a potential difference of $\Delta VO$ are connected to the input/output lines IO, $\overline{IO}$ which are at the second precharge level. Since the second precharge level is higher than any one of the potentials of the bit line BL and the complementary bit line $\overline{BL}$, the potential of each of the bit lines rises toward the second precharge level due to the sharing of charge with the input/output lines. That is, as shown in FIG. 3C, the potential of the bit line BL (or the complementary bit line $\overline{BL}$) rises as much as $\Delta V1'$, and that of the complementary bit line $\overline{BL}$ (or the bit line BL) rises as much as $\Delta V2'$. Consequently, the potential difference between the input/output line IO and the complementary input/output line $\overline{IO}$ becomes $\Delta V3'$, and above value $\Delta V3'$ is much higher than the conventional value $\Delta V3$.

Thereafter, owing to an input/output sensing amplifier, which is not shown in FIG. 1, connected to the input/output lines IO, $\overline{IO}$, the potential difference between the input/output lines IO, $\overline{IO}$ is split to a value larger than $\Delta V3'$. At the instant when the bit lines are connected to the input/output lines, or when the sensing and amplification for the input/output lines starts, a sufficient potential difference is formed between the pair of the input/output lines, and therefore, the data accessing speed through the input/output lines becomes faster than that of the conventional method, this being apparent to those skilled in the art.

Furthermore, according to the input/output line precharging method of the present invention, the data loaded on the input/output lines are sufficiently amplified and transmitted to a data output buffer which is not shown, and then the column enabling signal $\phi$YE is disabled to low state, and consequently, the second precharging signal $\phi$IOP is enabled again to high state. Thus, the pair of input/output lines IO, $\overline{IO}$ are equalized to a voltage around Vcc, because the equalized time is very short. Thereafter, if the input of row address signal RAi is completed at low state, the second precharging signal $\phi$IOP is disabled to low state, and the first precharging signal $\phi$IOPR is enabled, so that the input/output lines should be equalized to the first precharge level.

Under this condition, since the input/output line IO and the complementary input/output line $\overline{IO}$ are equalized to a voltage around ($\frac{1}{2}$)Vcc level before the enabling of the signal $\phi$IOPR, in the case where the signal $\phi$IOPR is enabled to high state, the equalized voltage becomes almost the same as the precharge voltage terminal VIOPR, so that the current flows in a smaller amount from the input/output lines to the precharge voltage terminal VIOPR, thereby greatly stabilizing the voltage of the terminal VIOPR compared that of with the conventional method.

Besides the above described embodiment, other embodiments for achieving the objects of the present invention will be possible, as will be apparent to those who have the ordinary skill in the art.

According to the present invention as described above, delay of the data accessing caused by an undesirable reduction of the potential difference during the connection of the input/output lines to the bit lines in the $\overline{RAS}$ active cycle can be prevented, thereby enabling the circuit to achieve high speed sensing and accessing on the input/output lines.

Furthermore, according to the present invention, the potentials of the input/output lines are stabilized and then equalized during the precharging of the input/output lines, thereby preventing the instability of the voltage of the precharge voltage terminal.

While the invention has been particularly shown and described with reference to a preferred embodiment, it will be understood by those skilled in the art that modifications in detail may be made without departing from the spirit and scope of the invention.

What is claimed is:

1. A method of precharging and equalizing input/output lines in a semiconductor memory device reading through bit lines information stored in a memory cell in accordance with a word line selected by a predetermined address signal, producing the read information through a selected column line, and precharging and equalizing said input/output lines to predetermined levels by using a first and second precharging circuits connected to said input/output lines, said method comprising steps of:
(a) supplying said first precharging circuit with a first precharging signal in accordance with the address signal for selecting said word line, during a time interval before said address signal is applied;
(b) supplying said second precharging circuit with a second precharging signal in accordance with said address signal and a signal for enabling the column line, during a time interval from receipt of the address signal to a time when the signal for enabling the column line is enabled;
(c) connecting said input/output lines to said bit lines with a predetermined potential difference therebetween, in accordance with a signal for selecting the column line;
(d) supplying said second precharging circuit with said second precharging signal after said signal for enabling the column line is disabled; and
(e) completing supply of said second precharging signal when said address signal input is completed, and supplying said first precharging circuit with said first precharging signal.

2. The method as claimed in claim 1, wherein said input/output lines are precharged and equalized to a first voltage level, during said step (a) and (e).

3. The method as claimed in claim 2, wherein said input/output lines are precharged and equalized to a second voltage level, during said steps (b) and (d).

4. The method as claimed in claim 3, wherein said first voltage level is lower than said second voltage level.

5. The method as claimed in claim 1, wherein a potential difference between said input/output lines is amplified, during said step (c).

6. The method as claimed in claim 1, wherein a potential of each of said bit lines is raised during said step of connecting said input/output lines to said bit lines.

7. A precharging signal circuit, comprising:
means for precharging and equalizing input/output lines in a semiconductor memory device reading through bit lines information stored in a memory cell; and
means for enabling said precharging means to precharge said input/output lines when an address signal is enabled and a column enabling signal is disabled, and alternatively, when said address signal is disabled and said column enabling signal is enabled.

8. A precharging signal circuit as set forth in claim 7, wherein said means for enabling said precharging means comprises:
a first inverter for inverting said column enabling signal;
logic gate means for receiving first data from said first inverter and said address signal, to provide a first output signal; and
a second inverter for inverting said first output signal.

9. The method as claimed in claim 1, wherein said input/output lines are precharged and equalized to a predetermined voltage level, during said steps (b) and (d).

10. The method as claimed in claim 4, wherein the potential difference between said input/output lines is amplified, during said step (c).

11. The precharging signal circuit as claimed in claim 7, wherein said precharging means comprises:
first precharge enabling means for enabling said precharging means to precharge said input/output lines to a first voltage level when said address signal is disabled;
second precharge enabling means for enabling said precharging means to precharge said input/output lines to a second voltage level when said address signal is enabledand said column enabling signal is disabled.

12. A circuit for precharging input/output lines of a memory device including two bit lines connected to a memory, said circuit comprising:
bit line sensing amplification means for sensing a first potential difference between said two bit lines and amplifying said first potential difference;
column gate means for connecting each one of said bit lines to a corresponding one of said input/output lines, respectively, in response to a column selection signal;
input/output sensing amplification means for sensing a second potential difference between said input-/output lines and amplifying said second potential difference;
first precharging mans for precharging said input-/output line as to a first voltage level in response to a first precharging signal;
second precharging means for precharging said input/output lines to a second voltage level in response to a second precharging signal;
first enabling means for enabling said first precharging means to precharge said input/output lines when an address signal is in a first state, by generating said first precharging signal; and
second enabling means for enabling said second precharging means to precharge said input/output lines when said address signal is in a second state and a column enabling signal is in said first state, by generating said second precharging signal.

13. The precharging signal circuit as set forth in claim 12, wherein said second enabling means comprises:
a first inverter for inverting said column enabling signal, to generated an inverted signal;
logic gate means for receiving said inverted signal and said address signal, to provide a first output signal; and
a second inverter for inverting said first output signal, to generate said second precharging signal.

14. The circuit as claimed in claim 12, wherein said column gate means connects each one of said bit lines to said corresponding one of said input/output lines, respectively, after said second precharging means precharges said input/output lines to said second voltage level and is then disabled, in order that charge sharing occurs between each one of said bit lines and said corresponding one of said input/output lines.

15. The circuit as claimed in claim 13, wherein said column gate means connects each one of said bit lines to said corresponding one of said input/output lines, respectively, after said second precharging means precharges said input/output lines to said second voltage level and is then disabled, in order that charge sharing occurs between each one of said bit lines and said corresponding one of said input/output lines.

16. The method as claimed in claim 1, further comprising:
sensing and amplifying a first voltage difference between said bit lines after said step (b) and before said step (c), to generate said predetermined potential difference;
elevating voltages of each one of said bit lines and generating a second voltage difference between said input/output lines, during said step (c); and
sensing and amplifying said second voltage difference between said input/output lines, to generate an input/output potential difference, during said step (c);

17. A precharging signal circuit, comprising:
means for precharging and equalizing input/output lines in a semiconductor memory device reading through bit lines information stored in a memory cell; and
means for enabling said precharging means to precharge said input/output lines when an address signal is enabled and a column enabling signal is disabled, and alternatively, for enabling said precharging means to precharge said input/output lines when said address signal is disabled and said column enabling signal is enabled.

* * * * *

UNITED STATES PATENT AND TRADEMARK OFFICE
CERTIFICATE OF CORRECTION

PATENT NO. : 5,262,995
DATED     : November 16, 1993
INVENTOR(S) : Je-Hwan YU

It is certified that error appears in the above-indentified patent and that said Letters Patent is hereby corrected as shown below:

On the title page: Item [54] and Column 1, line 1,

Change "IMPUT" to --INPUT--.

| | | | |
|---|---|---|---|
| Claim 2, | Column 7, | Line 5, | change "step" to --steps--; |
| Claim 11, | Column 7, | Line 55, | change "enabledand" to --enabled and--; |
| Claim 12, | Column 8, | Line 3, | change "mans" to --means--; |
| Claim 12, | Column 8, | Line 4, | change "line" to --lines--; |
| Claim 12, | Column 8, | Line 4, | delete "as". |

Signed and Sealed this

Twenty-fourth Day of May, 1994

Attest:

BRUCE LEHMAN

*Attesting Officer*    *Commissioner of Patents and Trademarks*